United States Patent [19]

Ohzu

[11] Patent Number: 5,506,430
[45] Date of Patent: Apr. 9, 1996

[54] SOLID STATE IMAGE PICK-UP DEVICE WITH DIFFERING CAPACITANCES

[75] Inventor: Hayao Ohzu, Fuchu, Japan

[73] Assignee: Canon Kabushiki Kaisha, Tokyo, Japan

[21] Appl. No.: 438,065

[22] Filed: May 8, 1995

Related U.S. Application Data

[63] Continuation of Ser. No. 23,116, Feb. 26, 1993, abandoned.

[30] Foreign Application Priority Data

Mar. 3, 1992 [JP] Japan .................................. 4-080231

[51] Int. Cl.$^6$ ...................................... H01L 31/00
[52] U.S. Cl. .......................... 257/292; 257/294; 257/435; 257/440; 257/465; 257/443
[58] Field of Search ..................... 257/293, 291, 257/294, 292, 443, 462, 440, 435, 465

[56] References Cited

U.S. PATENT DOCUMENTS

| | | | |
|---|---|---|---|
| 3,617,753 | 11/1971 | Kato et al. | 250/211 J |
| 4,437,112 | 3/1984 | Tanaka et al. | 358/44 |
| 4,547,074 | 10/1985 | Hinoda et al. | 356/405 |
| 4,672,432 | 6/1987 | Sakurada et al. | 358/75 |
| 4,791,469 | 12/1988 | Ohmi et al. | 357/30 |
| 4,879,470 | 11/1989 | Sugawa et al. | 250/578 |
| 4,907,074 | 3/1990 | Hashimoto | 358/47 |
| 4,954,703 | 9/1990 | Ohzu | 250/208 |
| 4,958,085 | 9/1990 | Hashimoto et al. | 307/262 |
| 5,124,544 | 6/1992 | Ohzu | 250/211 |
| 5,126,814 | 6/1992 | Nakamura et al. | 357/30 |
| 5,128,533 | 7/1992 | Oguchi | 250/208 |

FOREIGN PATENT DOCUMENTS

| | | | |
|---|---|---|---|
| 0437340 | 7/1991 | European Pat. Off. | |
| 56-19288 | 2/1981 | Japan | |
| 59-67791 | 4/1984 | Japan | |
| 60-97681 | 5/1985 | Japan | 257/440 |
| 60-91668 | 5/1985 | Japan | 257/440 |
| 61-257071 | 1/1986 | Japan | |
| 61-187282 | 8/1986 | Japan | 257/440 |
| 61-85760 | 12/1986 | Japan | 257/440 |
| 62-198257 | 9/1987 | Japan | |
| 63-170959 | 7/1988 | Japan | 257/440 |
| 0371669 | 3/1991 | Japan | 257/440 |

*Primary Examiner*—William Mintel
*Attorney, Agent, or Firm*—Fitzpatrick, Cella, Harper & Scinto

[57] ABSTRACT

A solid state image pick-up device has a first pixel for outputting a first color signal and a second pixel for outputting a second color signal different from the first color signal. The first and second pixels have semiconductor junctions between the first semiconductor region and the second semiconductor region, respectively, with different junction capacities from each other.

52 Claims, 9 Drawing Sheets

SOLID STATE IMAGE PICK-UP DEVICE WITH DIFFERING CAPACITANCES

This application is a continuation of application Ser. No. 08/023,116 filed Feb. 26, 1993, now abandoned.

BACKGROUND OF THE INVENTION

1. Field of the Invention

The present invention relates to a solid state image pick-up device for use in an information processing apparatus such as a copying machine or facsimile terminal equipment, and more particularly to a solid state image pick-up device with multiple pixels arranged and having a photoelectric conversion unit in which a signal corresponding to electric charge stored in the control electrode area by light illumination is output from one of the second main electrode areas.

2. Related Background Art

In recent years, solid state image pick-up devices of the CCD type in which a CCD is used in the scanning circuit have been typically well known. Also, because the output of a photoelectrically converted signal may decrease with higher definition of the photoelectric conversion elements, photoelectric conversion elements of the amplification type in which a photoelectrically converted signal can be amplified for output have gained popularity. Such amplification type photoelectric conversion elements include a bipolar transistor type, a field effect transistor type and an electrostatic induction transistor type. Among them, photoelectric conversion elements of the bipolar transistor type include a normal photo-transistor, as well as a photo-transistor in which the emitter is connected to a capacitive load as disclosed in U.S. Pat. No. 4,791,469 issued to the inventors Ohmi and Tanaka. Such a photoelectric conversion element of the amplification type with a bipolar transistor will be exemplified in the following.

Figure 15:
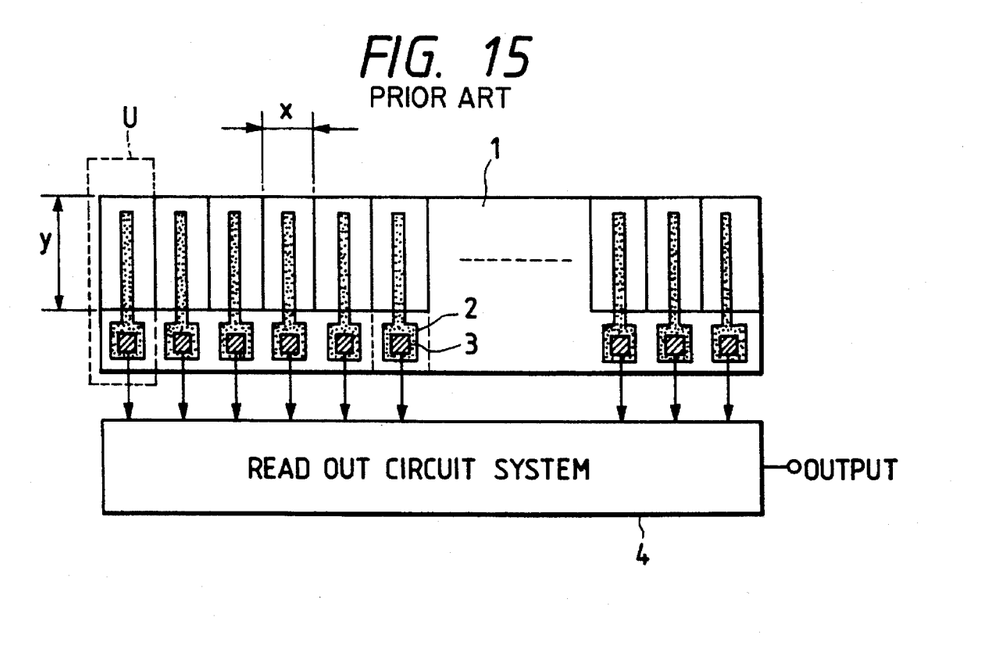
FIG. 15 is schematic top view showing a line sensor as a conventional solid state image pick-up device.

FIG. 15 is a schematic plan view showing a linear solid state image pick-up device using the above-mentioned bipolar sensor. In FIG. 15, 1 is a part of a semiconductor substrate which is a collector region of the bipolar type sensor. In addition, 2 and 3 are a base region and an emitter region of the bipolar type sensor, respectively, and 4 is a read-out circuit system which outputs a signal from each pixel sequentially. U (as indicated in the broken line) shows a light sensitive pixel (photoelectric conversion element) to provide a bipolar type sensor. Plural light sensitive pixels of the same structure are arranged in a linear format. It is to be noted herein that each pixel is shielded against light except for a light receiving face having an open area (x times y), wherein if these light receiving faces are equal in size (x times y), each pixel theoretically will have the same light sensitivity.

Figure 16:
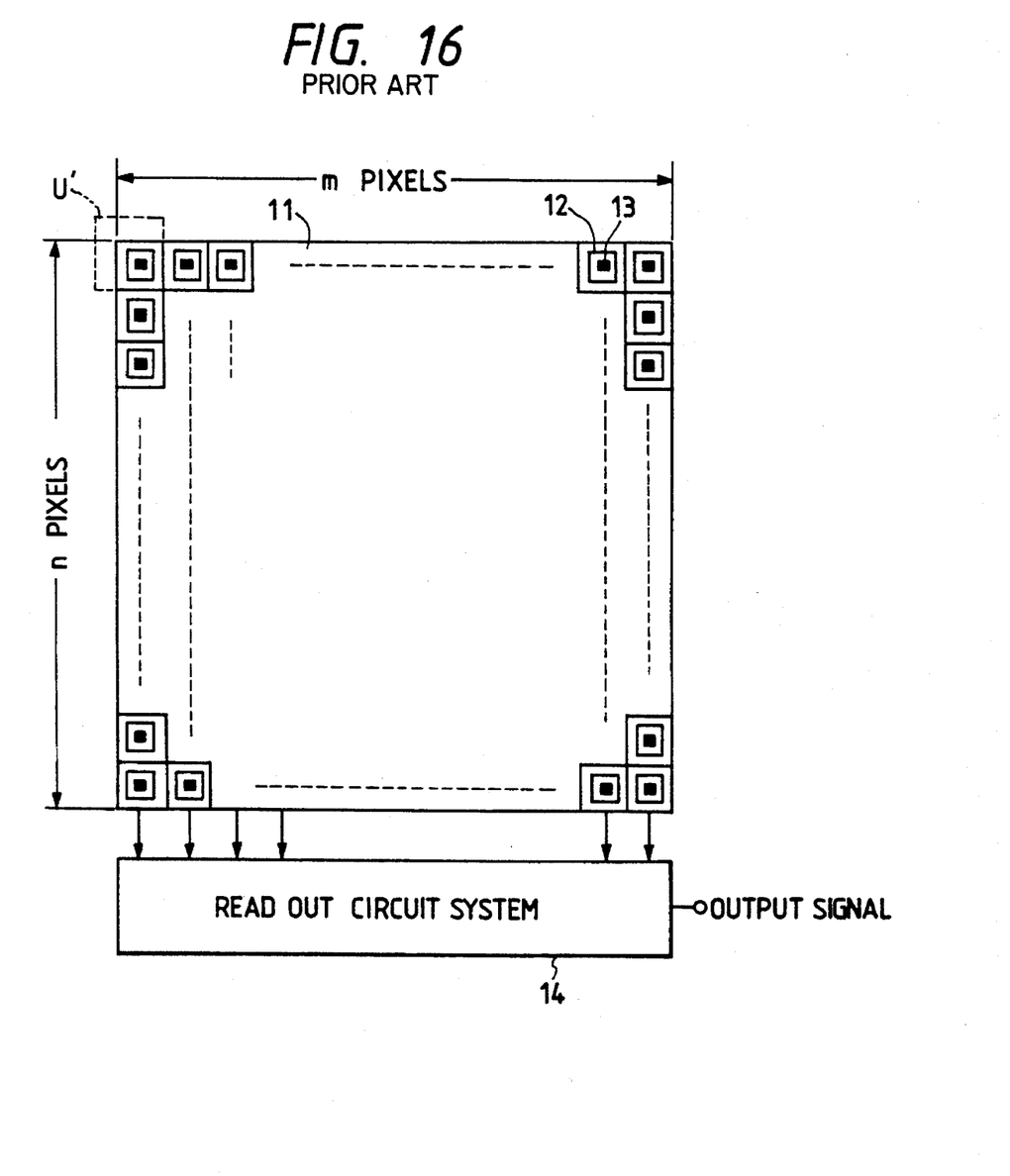
FIG. 16 is a schematic top view showing an area sensor as the conventional solid state image pick-up device.

FIG. 16 is a schematic plan view showing a two-dimensional solid state image pick-up device using the above-mentioned bipolar type sensors. In FIG. 16, 11 is a part of the semiconductor substrate which is a collector region of the bipolar type sensor. Also, 12 and 13 are a base region and an emitter region of the bipolar type sensor for each pixel, respectively, and 14 is a read-out circuit system which outputs a signal from each pixel sequentially. U' (as indicated in the broken line) shows a light sensitive pixel (photoelectric conversion element) providing a bipolar type sensor. Plural light sensitive pixels of the same structure are arranged in a two-dimensional format of m×n pixels. It is to be noted herein that if the light receiving faces of the pixels have light receiving areas or open areas or open areas of equal size, each pixel theoretically will have the same light sensitivity.

For the purpose of reading a monochromatic image, the constitutions of FIGS. 15 and 16 are most suitable.

However, since light signals from solar rays or lamp rays have spectral characteristics over wide wavelength regions, if a plurality of light signals which lie in mutually different wavelength regions are photoelectrically converted by different pixels, there may occur differences in sensitivity.

To facilitate understanding of this technical problem, the reading of a color image will be described below.

When reading a color image with a solid state image pick-up device having red light signal reading pixels (R pixels), green light signal reading pixels (G pixels) and blue light signal reading pixels (B pixels), it is common to dispose one color filter on each pixel in accordance with a certain rule. In this case, because the spectral transmission characteristics of color filters are different for each color, the sensitivity of a pixel having a color filter disposed is a value determined by the characteristic of the color filter, which may be different for each color. For example, when using red R, green G and blue B primary color filters, the sensitivity often has the relation that red sensitivity SR>green sensitivity SG>blue sensitivity SB.

An image read by such a color solid state image pick-up device is converted into an electric signal for each color, and output to a signal processing circuit at a later stage. In this case, because the sensitivity is different for each color owing to the reason previously mentioned, it is necessary to apply a different gain to each color output signal prior to its input into the signal processing circuit at the later stage, for example, so that the signal level of each color in reading with white uniform light may be equal. Such processing is referred to as white balance processing.

This white balance processing necessitates excess hardware or excess control at the system level, leading to an increase in cost. As one means for resolving this problem, it is contemplated that the sensitivity of each color is adjusted by varying the open area of the pixel for each color filter, but there is a risk that a different aperture characteristic for each color may be caused.

SUMMARY OF THE INVENTION

In order to resolve the above-mentioned technical problems, it is an object of the present invention to provide a solid state image pick-up device which can produce excellent output signals by substantially adjusting the actual sensitivity of each pixel so that equal sensitivity may be obtained.

It is another object of the present invention to provide a solid state image pick-up device which can substantially adjust the actual sensitivity of each pixel so that equal sensitivity may be obtained with a relatively simple constitution.

It is a further object of the present invention to provide a solid state image pick-up device having at least two pixels with the capacities of their semiconductor junctions being different from each other.

It is a still further object of the present invention to provide a solid state image pick-up device having at least two pixels with the capacities of their semiconductor junctions being different from each other, which pixels are shielded against light to make a pixel for a dark signal output.

The first object of the present invention can be accomplished by a solid state image pick-up device having a first pixel for outputting a first color signal and a second pixel for outputting a second color signal different from the first color signal, characterized in that said first and second pixels have respective semiconductor junctions between the first semiconductor region and the second semiconductor region, with different junction capacities from each other.

Also, the object of the present invention can be accomplished by a solid state image pick-up device comprising a first pixel having a first filter for outputting a first color signal, a second pixel having a second filter for outputting a second color signal, and a third pixel having a third filter for outputting a third color signal, characterized in that the capacity of the semiconductor junction of the first and second pixels is different from that of the third pixel.

Further, the object of the present invention can be accomplished by a solid state image pick-up device wherein a plurality of pairs including a first pixel for outputting a first color signal and a second pixel for outputting a second color signal are arranged as an array, characterized in that in each pair, the capacity of the semiconductor junction in the first pixel is different from that in the second pixel, and at least one of the plurality of pairs is shielded against light.

DETAILED DESCRIPTION OF THE PREFERRED EMBODIMENTS

The present invention will be described below with reference to the drawings. First, a solid state image pick-up device as shown in FIGS. 1A to 1C will be described to facilitate the understanding of the present invention.

Figure 1A:
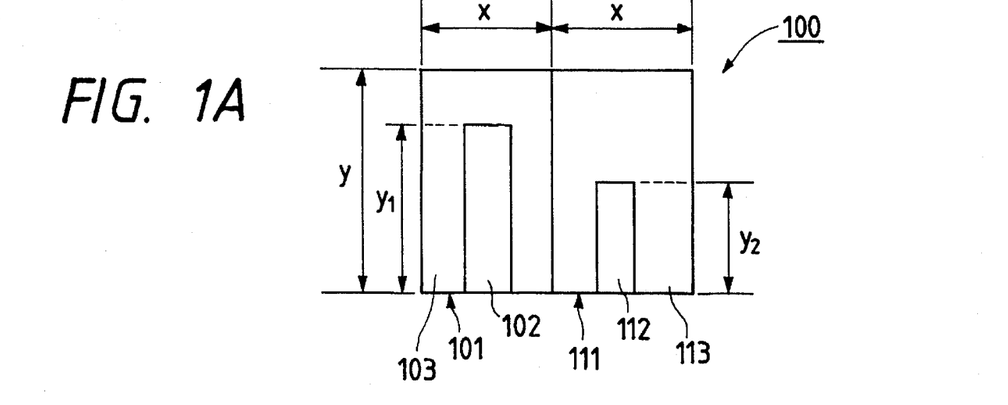
FIGS. 1A to 1C are schematic top views for explaining the pixel constitution in a solid state image pick-up device according to the present invention.
Figure 1B:
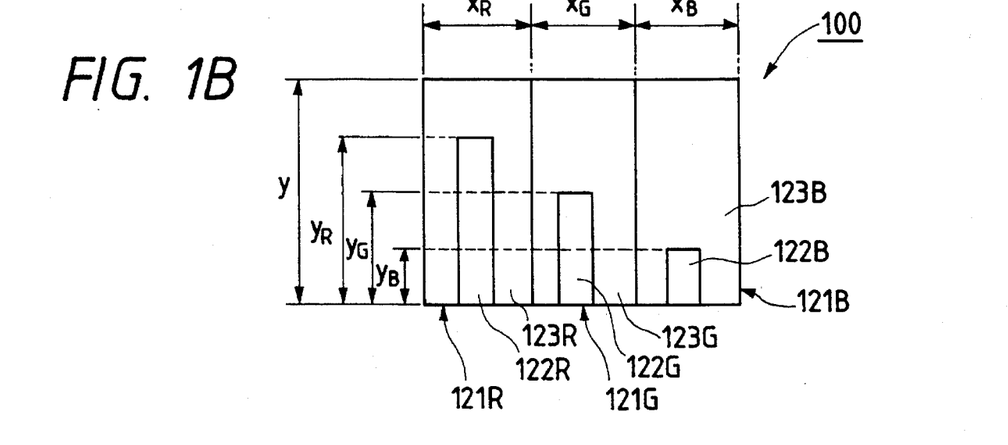
Figure 1C:
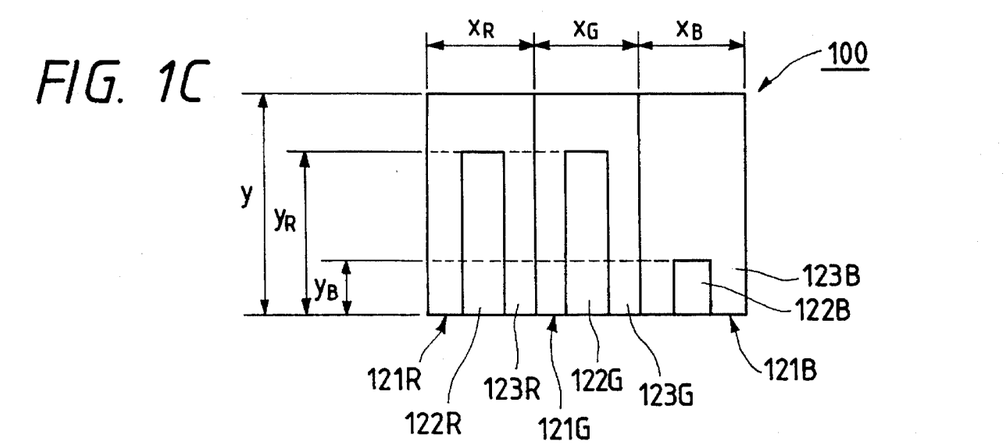

FIGS. 1A, 1B and 1C show pixel portions of the solid state image pick-up device in three embodiments.

In FIG. 1A, the lengths $y_1$, $y_2$ in semiconductor regions 102, 112 for a left pixel 101 and a right pixel 111 are varied to provide substantially the same sensitivity. The constitution in other portions is the same. Namely, when light in different wavelength regions is photoelectrically converted, the sensitivity of pixel 101 is higher and the sensitivity of pixel 111 is lower, if $y_1$ is equal to $y_2$. For this reason, the lengths of the semiconductor regions 102, 112 are made different so that the sensitivity to the light to be photoelectrically converted may be substantially equal.

In this case, each of the pixels 101, 111 may be a photo-diode or photo-transistor using a P-type semiconductor in the semiconductor regions 102, 112 and an N-type semiconductor in the semiconductor regions 103, 113.

On the other hand, in FIG. 1B, the lengths $y_R$, $y_G$ and $y_B$ of the semiconductor regions 122R, 122G and 122B for three pixels 121R, 121G and 121B are different, while the widths of the semiconductor regions 123R, 123G and 123B are the same, i.e., $X_R=X_G=X_B$, with the length y being equal, and the widths of the semiconductor regions 122R, 122G and 122B being the same.

Further, FIG. 1C is different from FIG. 1B as above described only in that the length of the semiconductor regions 122R, 122G is made equal to $y_R$. Even if three pixels 121R, 121G, 121B are of the same structure, the sensitivity of each of three pixels may be possibly different depending on the spectral characteristic of light to be detected and the light transmission characteristic of the color separation filter. In such a case, it is desirable to use the constitution of FIG. 1C.

In order to make all pixels of uniform sensitivity in the invention, various methods can be adopted.

For example, it is preferable that each pixel is constituted of a photo-diode, as shown in FIGS. 1A to 1C, with the area of the semiconductor junction (PN junction) changed, to adjust the sensitivity. Specifically, if the length or width of the PN junction is changed with the depth from the surface of semiconductor substrate being substantially constant, the PN junctions of all the pixels can be formed in a process using the same mask pattern. Of course, such pixels can be also formed by using an FET or SIT as a bipolar transistor in which the above PN junction is replaced with the base-collector junction, or a unipolar transistor in which the PN junction is replaced with the gate-drain junction.

And when light signals over wide wavelength regions from solar rays or halogen lamp rays are processed through the color separation and photoelectric conversion, it is desirable that a color separation filter is provided for each pixel of R, G, B to selectively transmit respective light of R, G, B therethrough to make photoelectric conversion on a pixel made of a semiconductor such as a single crystal silicon.

Figure 2:
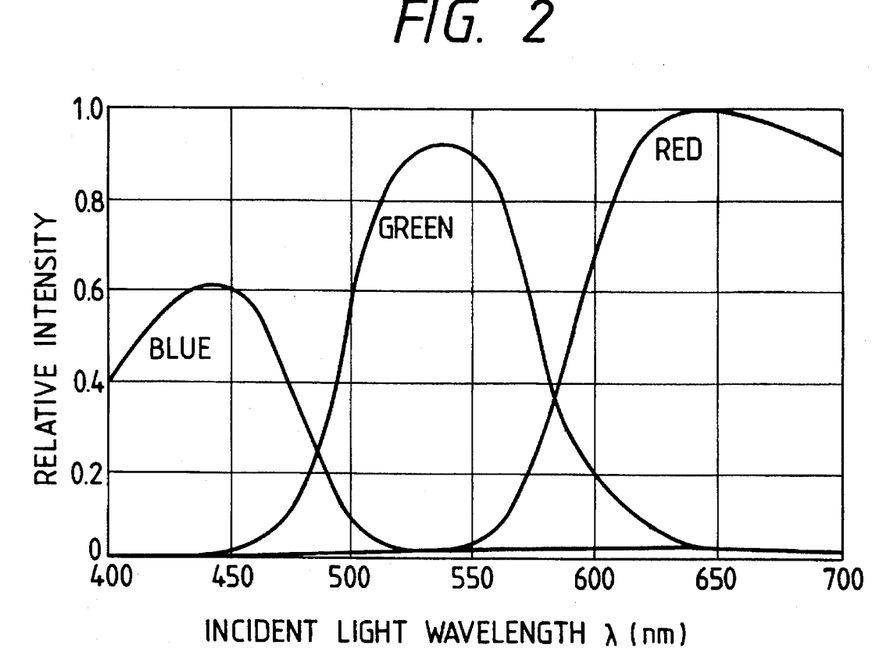
FIG. 2 is a graph showing examples of the spectral sensitivity characteristic in a semiconductor for use with the solid state image pick-up device according to the present invention.
Figure 3:
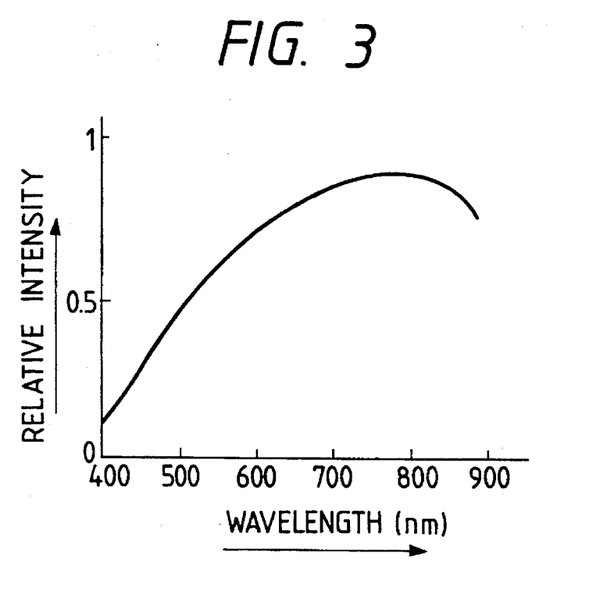
FIG. 3 is a graph showing an example of the spectral sensitivity characteristic of a color separation filter for use with the solid state image pick-up device according to the present invention.

In this case, the transmissivity of the filter may be as shown in FIG. 2, while the sensitivity of single crystal silicone may be as shown in FIG. 3. Accordingly, since only the blue sensitivity is relatively extremely low, it is desirable to have a pixel structure as indicated in FIG. 1C.

Of course, when only red and blue light is dealt with, or when only red and green light is dealt with, or when only green and blue light is dealt with, for example, a structure in which two pixels are made one pair as indicated in FIG. 1A, should be adopted.

By providing the junction capacities with differences sufficient to compensate for the spectral characteristics such as a transmissivity of the filter or a sensitivity of the semiconductor, an excellent color separated signal can be obtained.

Also, if such pixels shielded against the light are disposed on the same substrate to provide a pixel for dark signal output, an excellent removal of dark noise can be achieved.

In this case, it is desirable to operate on the signal from the shielded dark pixel and the light sensitive pixel having the same capacity.

The embodiments of the present invention will be described below with reference to the drawings, although the present invention is not limited to such embodiments, but various variations in design are possible within a range where the objects of the present invention can be accomplished.

(Embodiment 1)

Figure 4:
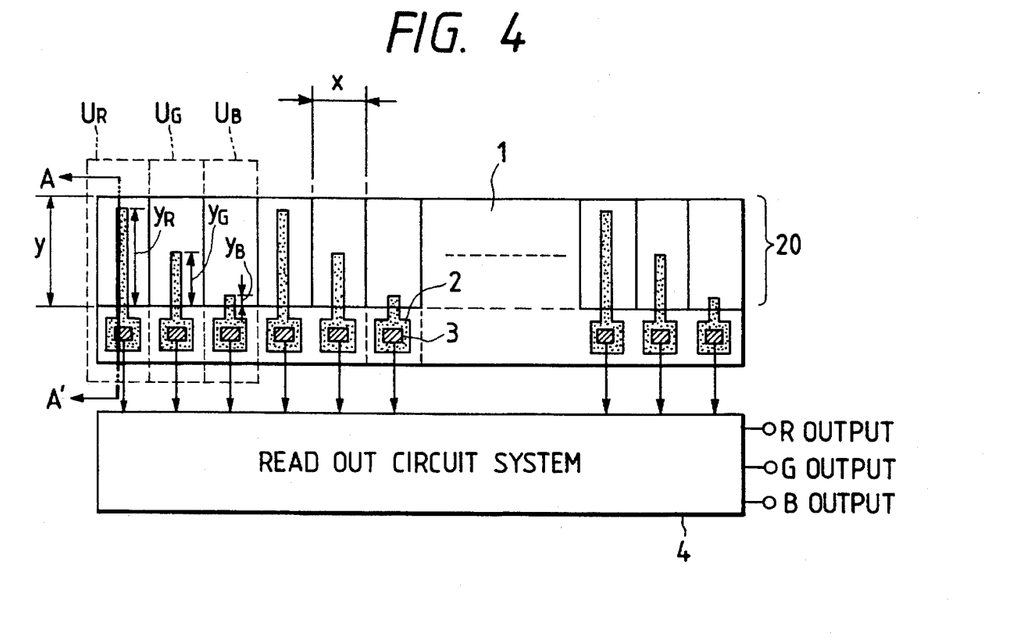
FIG. 4 is a schematic top view of a solid state image pick-up device according to an embodiment 1 of the present invention.
Figure 5:
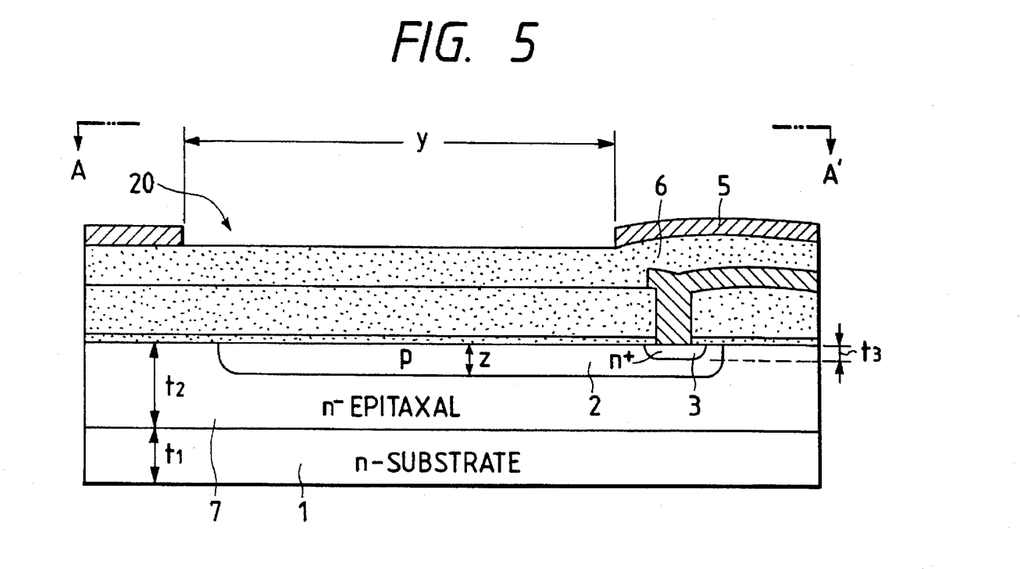
FIG. 5 is a schematic cross-sectional view showing a pixel in the solid state image pick-up device according to the embodiment 1 in cross section taken along the line A–A'.

FIG. 4 is a plan view showing the constitution of the first embodiment of a solid state image pick-up device according to the present invention, and FIG. 5 is a longitudinal cross-sectional view of one pixel ($U_R$) of FIG. 4. In FIGS. 15 and 4, like numerals indicate like components, the explanation of which is omitted.

This embodiment is a linear color solid state image pick-up device, with three color filters (not shown) of primary colors R, G, B. Note that the color filter is not shown in FIGS. 4 and 5, but is provided on the opening portion of each pixel. In FIG. 5, 5 is a light shielding membrane, 6 is an insulation layer, and 7 is an epitaxial layer on a semiconductor substrate 1, which constitutes a part of the collector region. Note that one pixel with an R filter disposed, one pixel with a G filter disposed, and one pixel with a B filter disposed constitute one triad, and such triads are arranged as an array.

As shown in FIG. 4, in this embodiment, in order to make equivalent the sensitivity of each color pixel for R, G, B, the shape of base region 2 for the pixel $U_R$, $U_G$, $U_B$ having a color filter of R, G, B respectively disposed is changed in accordance with the magnitude relation (R>G>B) in the spectral transmission characteristic of the color filter, such that the length of base region 2 is greater in the order of R, G, B. In this way, the base-collector capacity $C_{bc}$ is varied such as $$C_{bcR} > C_{bcG} > C_{bcB}$$

($C_{bcR}$: base-collector capacity for pixel $U_R$, $C_{bcG}$: base-collector capacity for pixel $U_G$, $C_{bcB}$: base-collector capacity for pixel $U_B$), corresponding to the magnitude relation in the spectral transmission characteristic of color filter. This is based on a the theory that the light-voltage conversion gain of a pixel is inversely proportional to the base-collector capacity $C_{bc}$.

According to this embodiment, when reading white uniform light, the output signal level (sensitivity) of each color is substantially equal, whereby it is possible to perform directly the signal processing without adjusting the gain for each color in a subsequent circuit.

In this embodiment, the depth of base region 2 is equal for all the pixels $U_R$, $U_G$, $U_B$. Of course, since the thickness of substrate $t_1$, the thickness of n⁻ epitaxial layer 7 $t_2$, and the thickness of emitter 3 $t_3$ are the same, the junction capacity (storage capacity) can be easily changed by changing only the length of base region 2 in an opening portion 20 as indicated by $y_R$, $y_G$, $y_B$ in FIG. 4. Such a constitution allows the sensitivity to be adjusted without greatly changing the current amplification factor ($h_{fe}$) of the transistor or the withstand voltage.

(Embodiment 2)

Figure 6:
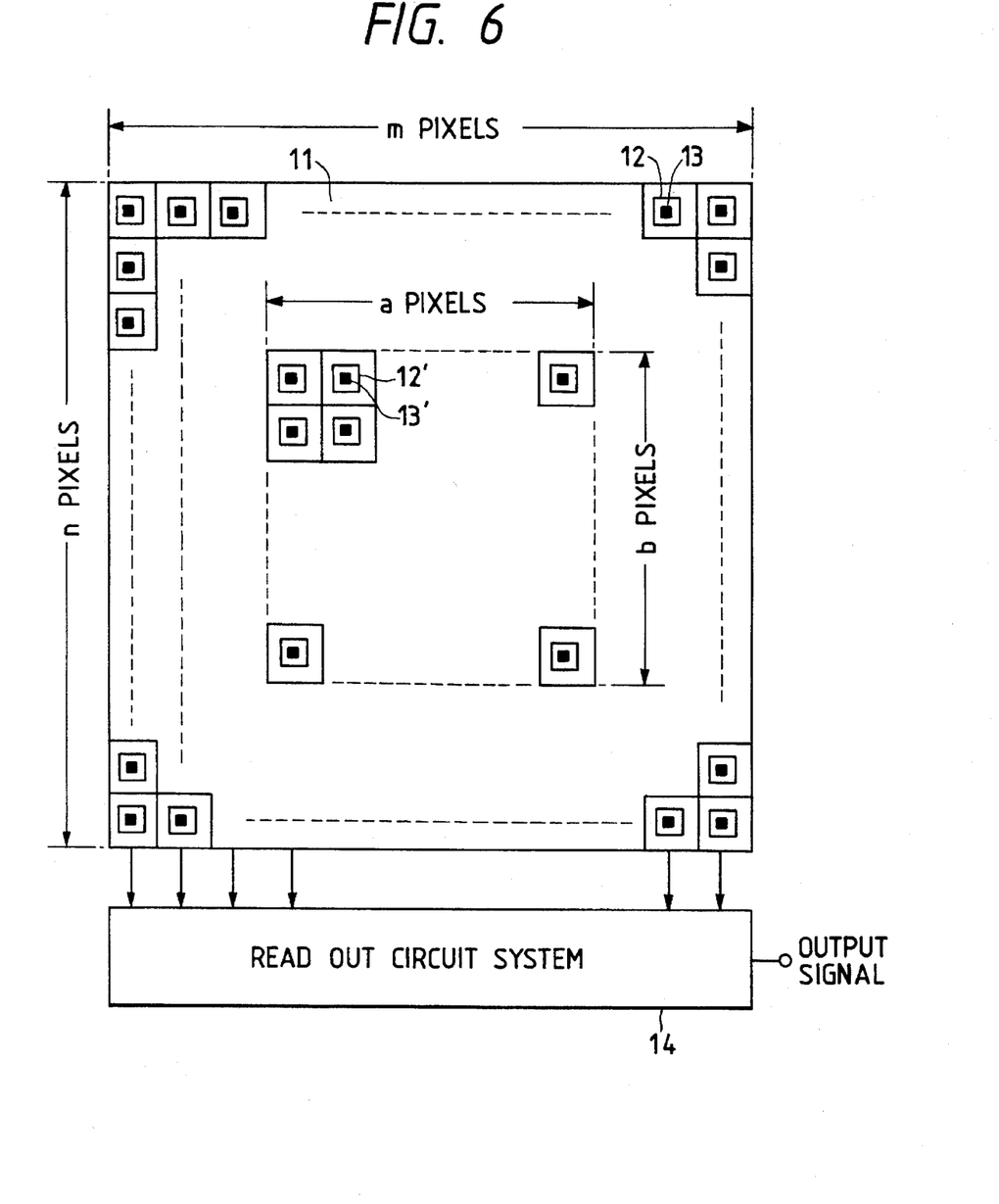
FIG. 6 is a schematic top view of a solid state image pick-up device according to an embodiment 2 of the present invention.
Figure 7:
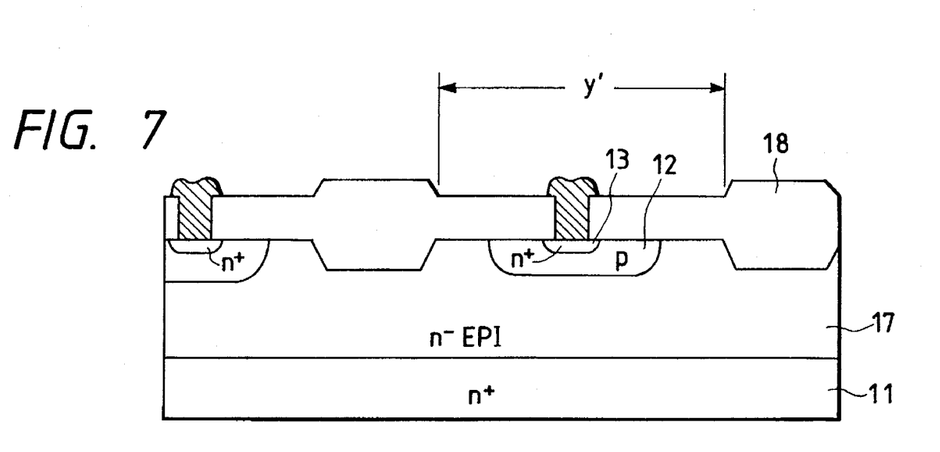
FIG. 7 is a schematic cross-sectional view of a pixel in the solid state image pick-up device according to the embodiment 2.

FIG. 6 is a plan view showing the second embodiment of a solid state image pick-up device according to the present invention, and FIG. 7 is a longitudinal cross-sectional view of one pixel as shown in FIG. 1. In FIGS. 16 and 6, like numerals indicate like components, the explanation of which is omitted.

This embodiment is an application example of a two-dimensional solid state image pick-up device, in which m×n pixels are arranged in two dimensions, with a first region consisting of a×b (m>a, n>b) pixels and a second region consisting of all pixels except for those in the first region, as shown in FIG. 6. It is to be noted that m×n pixels are arranged at an equal pitch in both the row and column directions, with the opening area sensitive to light being equal in size.

In FIGS. 6 and 7, 12 is a base region (base area $A_{bc2}$) of a pixel in the second region, 13 is an emitter region of a pixel in the second region, while 12' is a base region (base area $A_{bc1}$) of a pixel in the first region, and 13' is an emitter region of a pixel in the first region. Also, in FIG. 7, 17 is an epitaxial layer (constituting a part of collector region) on a semiconductor substrate 11, and 18 is a selective oxide region for the isolation of each pixel. Further, y' is a width of the opening portion.

The base area $A_{bc1}$ of a pixel in the first region is smaller than the base area $A_{bc2}$ of a pixel in the second region ($A_{bc1} < A_{bc2}$). Accordingly, there is a relation of $S_1 > S_2$ between the sensitivity $S_1$ of a pixel in the first region and the sensitivity $S_2$ of a pixel in the second region, because if the opening area is equal, the sensitivity is inversely proportional to the base-collector capacity $C_{bc}$ ($S \propto 1/C_{bc}$), and further the base-collector capacity $C_{bc}$ is substantially proportional to the base area $A_{bc}$ ($C_{bc} \propto A_{bc}$).

This means that the two-dimensional area of m×n pixels is divided into two areas (i.e., a×b area and the other area) which have different weightings of sensitivity.

For example, for a certain image, when weighting information in the central area of the image, in the conventional two-dimensional solid state image pick-up devices, a method is known in which the whole image is first read and converted into electric signal, and only signals in the weighted region are sampled from output signals to apply gain to those signals. However, in the two-dimensional solid state image pick-up device according to this embodiment of the present invention, only the base-collector capacity $C_{bc}$ of a pixel in the weighted region is changed, whereby the weighting can be easily made. In this case, the output signal is directly a weighted signal, and therefore, there will be no need to perform the excess processing at a later stage, so that simplification and lower costs for the later stage circuit can be realized.

As above described, according to the present invention, the sensitivity of a pixel can be varied without the need to change the opening area of the pixel or provide any excess signal processing circuit at the later stage, so that a color solid state image pick-up device at lower costs and with higher functions can be provided.

(Embodiment 3)

This embodiment involves a line sensor as a color solid state image pick-up device having a pixel structure as indicated by FIG. 1C.

Figure 8:
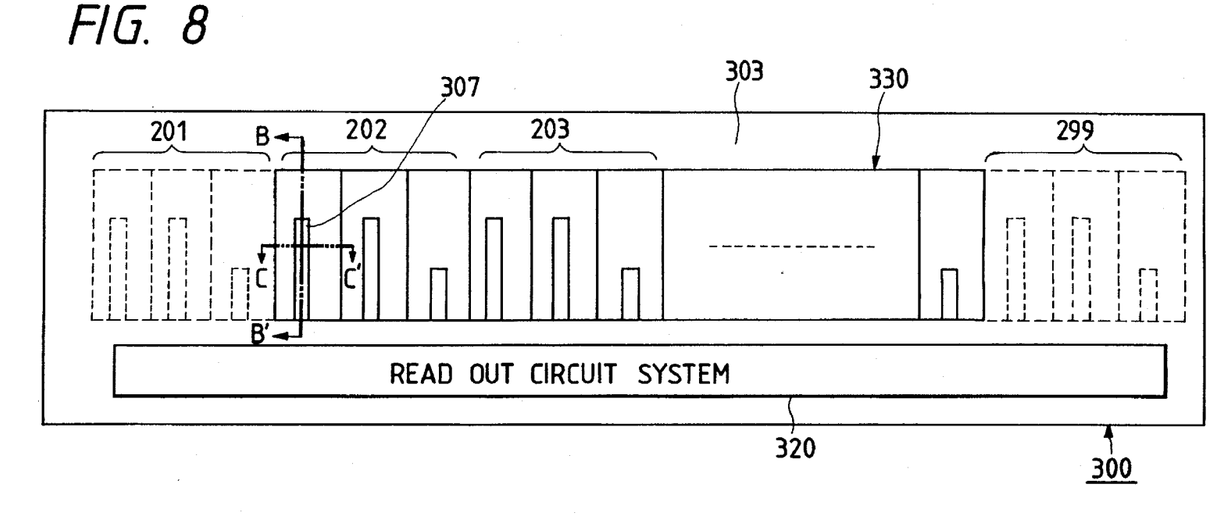
FIG. 8 is a schematic top view of a solid state image pick-up device according to an embodiment 3 of the present invention.

FIG. 8 is a schematic plan view showing a line sensor 300 in this embodiment, in which a pixel array 330 and a read-out circuit 320 are juxtaposed on the surface of a semiconductor chip.

Figure 9:
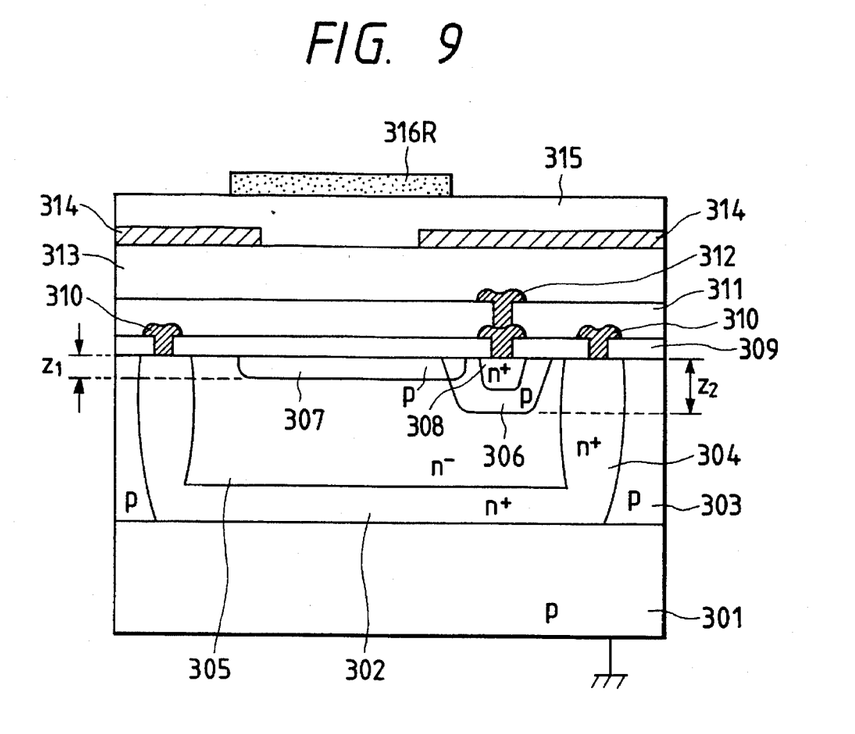
FIG. 9 is a schematic cross-sectional view showing a pixel in the solid state image pick-up device according to the embodiment 3 in cross section taken along the line B–B' of FIG. 8.
Figure 10:
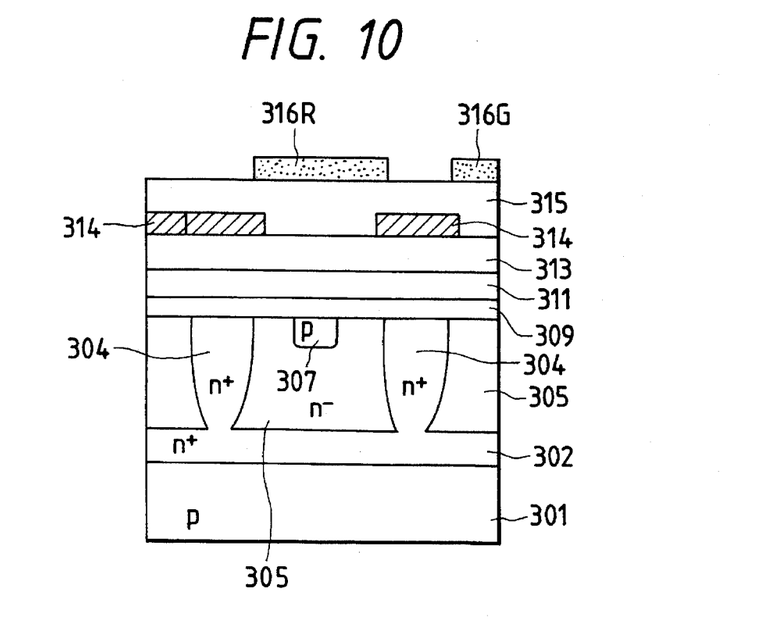
FIG. 10 is a schematic cross-sectional view showing a pixel in the solid state image pick-up device according to the embodiment 3 in cross section taken along the line C–C' of FIG. 8.

FIG. 9 is a longitudinal cross-sectional view of a pixel near a light receiving portion thereof, taken along the line B–B' of FIG. 8, and FIG. 10 is a transverse cross-sectional view of a pixel near the light receiving portion, taken along the line C–C' of FIG. 8.

Figure 11:
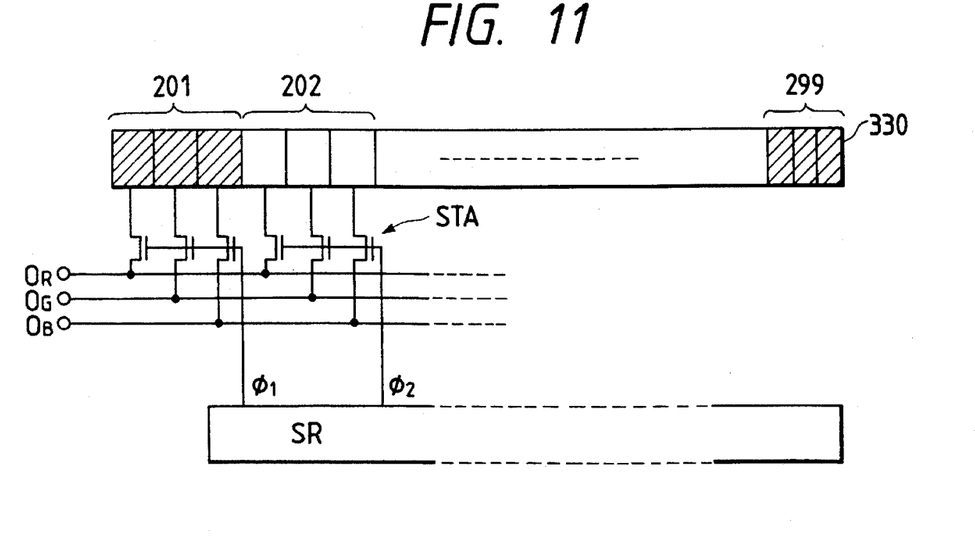
FIG. 11 is a circuit configuration diagram of the solid state image pick-up device according to the embodiment 3.
Figure 12:
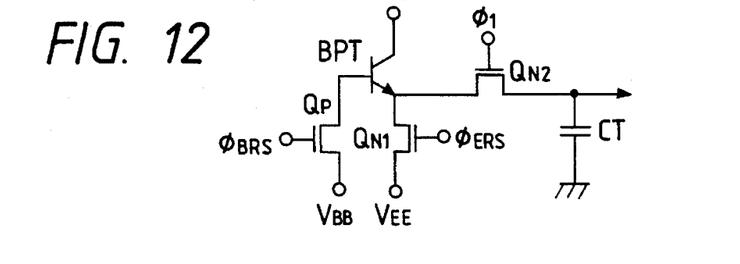
FIG. 12 is a circuit diagram of a pixel in the solid state image pick-up device according to the embodiment 3.

FIG. 11 is a circuit configuration diagram of the line sensor 300, and FIG. 12 is a circuit diagram of one pixel.

Figure 13:
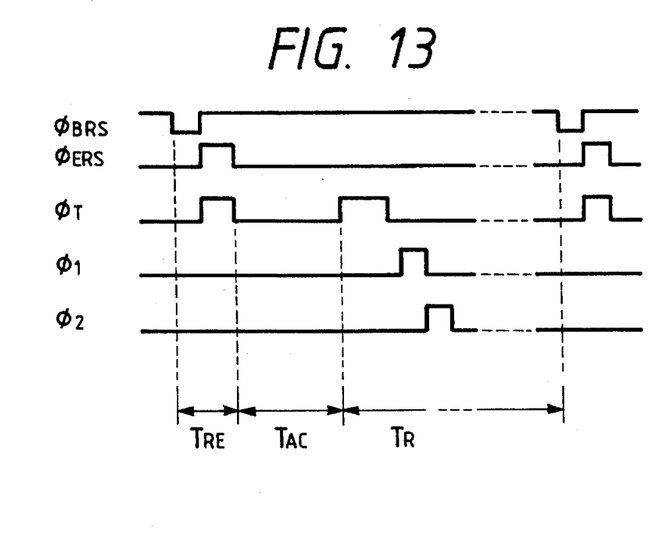
FIG. 13 is timing diagrams for explaining the driving method of the solid state image pick-up device according to the embodiment 3.

FIG. 13 is a timing chart for explaining a driving method of the line sensor 300.

In the line sensor 300 of this embodiment, light is permitted to be incident only upon the base and collector portions of a bipolar transistor BPT constituting a pixel with a light shielding layer 314.

In FIG. 9, on a P-type silicon substrate 301 is disposed a pixel array 330 surrounded by an element isolation region 303 of P-type silicon, in which a transistor BPT constituting one pixel involves a collector region having $n^+$ type buried layer 302, $n^+$ type contact layer 304, and $n^-$ type epitaxial layer 305, a base region having P-type semiconductor layer 307, and an $n^+$ type emitter region 308.

Also, on the surface, there are provided an insulation layer 309, a collector electrode 310, an emitter electrode 312, an insulation layer 313, a light shielding layer 314, a planerized layer 315, and a filter 316R.

The light shielding layer 314, made of Al, Cr or a black organic resin, is provided on a P-type semiconductor layer 306 having a deep junction as the base, the emitter region 308 provided inside thereof, and the $n^+$ contact layer 304 of the collector, thereby preventing light from directly entering these regions.

Also, by enclosing the periphery and bottom face of the $n^-$ epitaxial layer 305 which mainly produces light carriers within the $n^+$ buried layer 302 and the $n^+$ contact layer 304, light carriers are prevented from escaping into adjacent pixels, while under the action of the light shielding layer 314.

And the adjustment of stored capacity is conducted such that the length of P-type semiconductor layer 307, i.e., the length in a sub-scan direction, is made equal to almost 1/20 when the length of an R pixel and a G pixel is 1.

Further, the line sensor 300 has a pair of light shielding pixels 201, 299 of the same transistor structure on both ends of the light sensitive pixels 202, 203, . . . . These are of the same constitution as a pair of light sensitive pixels 202, 203 except that they are shielded against light by the light shielding layer 314.

The operation of reading a signal based on carriers stored in the base region of each pixel in the line sensor 300 will be explained below.

A basic operation principle is described in U.S. Pat. No. 4,810,896, issued to the inventors Tanaka et al.

A triad of R, G, B signals are output to three respective output lines simultaneously by a scan transistor array STA and a shift transistor SR. This is sequentially scanned from a leftmost triad 201 of the light shielding pixel to a rightmost triad 299 of the light shielding pixel.

Each pixel is constituted as shown in FIG. 12, with a PMOS transistor $Q_P$ connected to the base of a phototransistor and the NMOS transistors $Q_{N1}$ and $Q_{N2}$ connected to the emitter thereof. A voltage source $V_{CC}$ is connected to the collector.

At the timings as shown in FIG. 13, after the base is first connected to a voltage source $V_{BB}$ during the reset period, the emitter is connected to a voltage source $V_{EE}$.

At this time, the potentials of $V_{BB}$ and $V_{EE}$ are set so that the base-emitter junction of transistor BPT be sufficiently forward biased.

Specifically, $V_{BB}$ is set to about +3.0 V and $V_{EE}$ is set to about +0 V. Then, in a storage period $T_{AC}$, the base and the emitter are floating, whereby holes of carriers arising upon incident light are stored in the base.

Thereafter, if the NMOS transistor $Q_{N2}$ is turned on with a pulse $\rho_T$ to connect the emitter to a capacitive load $C_T$, the signal voltage is read out into the load $C_T$ owing to the dividing capacity.

Then, as previously described, the signal voltage is read out sequentially as R, G, B signals to three output lines by the scan transistor array STA and the shift register SR.

With this line sensor, it is possible to remove the noise effectively by compensating the color signal in such a way as to adjust the length of the base, with the same constitution of the light shielding pixel and the light sensitive pixel.

Specifically, by calculating differences ($R_b$–$R_d$, $G_b$–$G_d$, $B_b$–$B_d$) between the signals ($R_d$, $G_d$, $B_d$) of light shielding pixels R, G, B stored in memory, and the signals ($R_b$, $G_b$, $C_b$) of light sensitive pixels to be read later, a light signal with the dark signal removed can be obtained.

Another method is to calculate the difference between the first read signal and the later read signal which is delayed by delaying means. Such a differential calculation can be made easily by means of a differential amplifier.

Figure 14:
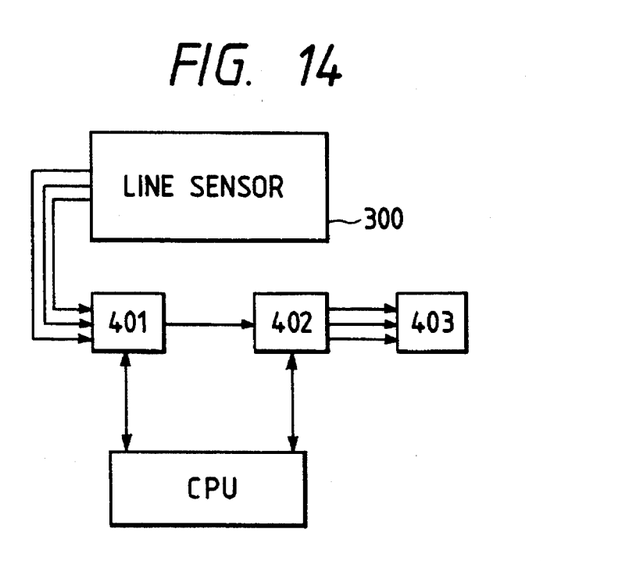
FIG. 14 is a control block diagram of an image information processor using a solid state image pick-up device according to the present invention.

FIG. 14 is a control system block diagram of an image information processing apparatus using a solid state image pick-up device of the present invention.

In an example of using the line sensor 300 in the embodiment 3, 401 is a signal processing circuit, including a circuit for converting R, G, B signals into yellow (Y), cyan (C) and magenta (M) signals, respectively, in addition to the memory and the differential amplifier as previously described.

Also, 402 is a head driving circuit, in which converted Y, C, M signals are supplied to a head 403.

The head 403 is an ink jet head for discharging ink droplets by heat energy, having three color heads of Y, C, M, in which the recording or printing is performed onto a recording medium using yellow ink, cyan ink and magenta ink.

The entire control thereof can be performed by a central processing unit CPU.

What is claimed is:

1. A solid state image pick-up device having a first pixel for outputting a first color signal and a second pixel for outputting a second color signal different from the first color signal, characterized in that:

each of said first and second pixels has a semiconductor junction between a first semiconductor region and a second semiconductor region thereof, respectively, wherein said junctions have different junction capacities from each other and said first and second pixels have substantially a same aperture area, wherein the first semiconductor regions of said first and second pixels have a same depth and different lengths.

2. The solid state image pick-up device according to claim 1, characterized in that said first and second pixels include respective filters having different spectral transmissivities, respectively, and said first and second pixels have a sufficient difference between said junction capacities to compensate for a difference of filter characteristics of the filters.

3. A solid state image pick-up device comprising a first pixel having a first filter for outputting a first color signal, a second pixel having a second filter for outputting a second color signal, and a third pixel having a third filter for outputting a third color signal, characterized in that:

each of said first, second and third pixels includes a respective semiconductor junction, and a capacity of said semiconductor junction in said first and second pixels is different from that of said third pixel, and said first, second and third pixels have substantially a same aperture area, wherein each of the semiconductor junctions is formed from a first semiconductor region and has a capacity which is varied by changing a length of the first semiconductor region while a width and a depth of the first semiconductor region remain equal.

4. The solid state image pick-up device according to claim 3, wherein the first color signal is red, the second color signal is green, and the third color signal is blue.

5. A solid state image pick-up device wherein a plurality of pairs of pixels including a first pixel for outputting a first color signal and a second pixel for outputting a second color signal are arranged as an array, characterized in that:

each pixel includes a semiconductor junction and an aperture area on which light is incident, and in each pair of pixels, a capacity of said semiconductor junction in said first pixel is different from that in said second pixel, the aperture areas of the first and second pixels are substantially the same, and at least one of the plurality of pairs of pixels is shielded against light.

6. The solid state image pick-up device according to claim 1, wherein each pixel includes a bipolar transistor.

7. The solid state image pick-up device according to claim 3, wherein each pixel includes a bipolar transistor.

8. The solid state image pick-up device according to claim 5, wherein each pixel includes a bipolar transistor.

9. The solid state image pick-up device according to claim 1, wherein each pixel includes a photo-diode.

10. The solid state image pick-up device according to claim 3, wherein each pixel includes a photodiode.

11. The solid state image pick-up device according to claim 5, wherein each pixel includes a photo-diode.

12. A photoelectric conversion device comprising a first pixel for outputting a first color signal, and a second pixel for outputting a second color signal different from the first color signal, wherein each of said first and second pixels has an aperture area and a semiconductor junction, the aperture areas of the first and second pixels being substantially equal, and a capacitance of the semiconductor junction of the first pixel being different from a capacitance of the semiconductor junction of the second pixel, wherein each of the semiconductor junctions is formed between a first semiconductor region of a first conductivity type and a second semiconductor region of a second conductivity type, and the second semiconductor region of the first pixel and the second semiconductor region of the second pixel has a same depth and different areas.

13. A device according to claim 12, wherein said semiconductor junctions have respectively different lengths.

14. A device according to claim 12, wherein each said aperture area has a same area as a light transmitting section defined by a light shielding layer.

15. A device according to claim 12, wherein each said semiconductor junction is a PN junction of a photodiode.

16. A device according to claim 12, wherein each said semiconductor junction is a base-collector junction of a phototransistor.

17. A device according to claim 12, further comprising:

respective color filters corresponding to said first and second pixels.

18. A device according to claim 12, wherein said first and second pixels have respective color filters of different spectrum transmittances, and have different capacitances for compensating for the spectrum transmittance difference of the filters.

19. A photoelectric conversion device comprising a first pixel for outputting a first color signal, a second pixel for outputting a second color signal, and a third pixel for outputting a third color signal, wherein each said pixel has an aperture area and a semiconductor junction, and wherein said first, second and third pixels have substantially the same aperture areas, and capacitances of the semiconductor junctions of said first, second and third pixels are classified into two groups.

20. A device according to claim 19, wherein said first and second pixels have substantially the same capacitances at the semiconductor junctions thereof, and said third pixel has a capacitance at the semiconductor junction thereof different from the capacitances of said first and second pixels.

21. A device according to claim 19, wherein said first, second and third pixels have capacitances at the semiconductor junctions thereof different from each other.

22. A device according to claim 19, wherein each said semiconductor junction is formed between a first semiconductor region of a first conductivity type and a second semiconductor region of a second conductivity type, and the second semiconductor region of one of said first and second pixels and the second semiconductor region of the third pixel have substantially the same depth and different areas.

23. A device according to claim 19, wherein each said semiconductor junction is formed between a first semiconductor region of the first conductivity type and a second semiconductor region of a second conductivity type, and the second semiconductor regions of the first, second and third pixels have substantially the same depth and different areas.

24. A device according to claim 19, wherein each said aperture area is defined by a light shielding layer.

25. A device according to claim 19, wherein each said semiconductor junction is PN junction of a photodiode.

26. A device according to claim 19, wherein each said semiconductor junction is a base-collector junction of a phototransistor.

27. A device according to claim 19, further comprising: respective color filters corresponding to the first, second and third pixels.

28. A device according to claim 19, wherein said first, second and third pixels are red, green and blue pixels.

29. A photoelectric conversion device comprising plural arranged photoelectric conversion elements, each photoelectric conversion element comprising a first pixel having a first color filter for outputting a first color signal, a second pixel having a second color filter for outputting a second color signal, and a third pixel having a third color filter for outputting a third color signal, wherein each of said pixels has an aperture area and a semiconductor junction, and wherein said first, second and third pixels of each of said photoelectric conversion elements has substantially a same aperture area, and capacitances of the semiconductor junctions of said first, second and third pixels are classified into two groups.

30. A device according to claim 29, wherein said semiconductor junctions of said first and second pixels have the same capacitance, and said third pixel has a capacitance different from that of said first and second pixels.

31. A device according to claim 29, wherein said first, second and third pixels have semiconductor junction capacitances different from each other.

32. A device according to claim 29, wherein each said semiconductor junction is formed between a first semiconductor region of a first conductivity type and a second semiconductor region of a second conductivity type, and the second semiconductor region of the first and second pixels and the second semiconductor region of the third pixel have a same depth and different areas.

33. A device according to claim 29, wherein each said semiconductor junction is formed between the first semiconductor region of the first conductivity type and the second semiconductor region of the second conductivity type, and the second semiconductor region of the first, second and third pixels have substantially a same depth and different areas.

34. A device according to claim 29, wherein each said aperture area is defined by a light shielding layer.

35. A device according to claim 29, wherein each said aperture area has a same area as that of a light transmitting section defined by a light shielding layer.

36. A device according to claim 29, wherein each said semiconductor junction is a PN junction of a photodiode.

37. A device according to claim 29, wherein each said semiconductor junction is a base-collector junction of a phototransistor.

38. A device according to claim 29, wherein a difference between the capacitances of said first, second and third pixels is sufficient to compensate for a difference between transmittance differences of the first, second and third filters.

39. A photoelectric conversion device comprising:

a first pixel for outputting a first color signal; and a second pixel for outputting a second color signal different from the first color signal;

wherein each of said first and second pixels have an aperture region and a semiconductor junction; and wherein the aperture regions of said first and second pixels have substantially a same area, capacitances of the semiconductor junctions of said first and second pixels are different, each of the semiconductor junctions is formed between a first semiconductor region of a first conductivity type and a second semiconductor region of a second conductivity type, and the second semiconductor region of said first pixel and the second semiconductor region of said second pixel have substantially a same depth and a same width and different lengths.

40. A device according to claim 39, wherein each of the apertures has a same area as a light-shielding section defined by a light-shielding layer.

41. A device according to claim 39, wherein each of the semiconductor junctions is a PN junction of a photodiode.

42. A device according to claim 39, wherein each of the semiconductor junctions is a base-collector junction of a phototransistor.

43. A device according to claim 39, further comprising color filters respectively corresponding to said first and second pixels.

44. A device according to claim 39, wherein said first and second pixels have color filters for transmitting respectively different spectrums of light, and have different capacitances for compensating for a difference in transmittances of the color filters.

45. A device according to claim 1, claim 3, claim 12, claim 19 or claim 29, further comprising:

a converter for converting first and second color signals from said device to other color signals.

46. A solid state image pick-up device according to claim 5, further comprising:

a converter for converting first and second color signals from said apparatus to other color signals; and a calculator for calculating said first and second color signals.

47. The device according to claim 45, wherein said device has an ink jet recording head.

48. The device according to claim 5, wherein said device has an ink jet recording head.

49. The device according to claim 45, wherein said device has an ink jet recording head for discharging ink by the use of heat energy.

50. The device according to claim 5, wherein said device has an ink jet recording head for discharging ink by the use of heat energy.

51. The device according to claim 45, wherein said device performs recording by using inks including yellow, cyan and magenta.

52. The device according to claim 5, wherein said device performs recording by using inks including yellow, cyan and magenta.

* * * * *

UNITED STATES PATENT AND TRADEMARK OFFICE
CERTIFICATE OF CORRECTION

PATENT NO. : 5,506,430

DATED : April 9, 1996

INVENTOR(S) : HAYAO OHZU

It is certified that error appears in the above-indentified patent and that said Letters Patent is hereby corrected as shown below:

IN THE DRAWINGS

Sheet 3 of 9, FIG. 5 "n-EPITAXAL" should read --n-EPITAXIAL--.

ON THE TITLE PAGE

[56] References Cited

"0371669 3/1991 Japan should read --3-71669 3/1991 Japan-- and "61-257071 1/1986 Japan" should read --61-257071 11/1986 Japan--.

Signed and Sealed this

Third Day of September, 1996

Attest:

BRUCE LEHMAN

Attesting Officer  Commissioner of Patents and Trademarks